(12) United States Patent
Cheng et al.

(10) Patent No.: US 6,806,138 B1
(45) Date of Patent: Oct. 19, 2004

(54) INTEGRATION SCHEME FOR ENHANCING CAPACITANCE OF TRENCH CAPACITORS

(75) Inventors: Kangguo Cheng, Beacon, NY (US); Hiroyuki Akatsu, Yorktown Heights, NY (US); Rama Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,890

(22) Filed: Jan. 21, 2004

(51) Int. Cl.[7] .......................................... H01L 21/8242
(52) U.S. Cl. .................. 438/243; 438/255; 438/244; 438/386; 438/249
(58) Field of Search ................................ 438/243–255, 438/386, 396, 398

(56) References Cited

U.S. PATENT DOCUMENTS

| | | | | |
|---|---|---|---|---|
| 4,906,590 A | * | 3/1990 | Kanetaki et al. | 438/386 |
| 5,877,061 A | * | 3/1999 | Halle et al. | 438/386 |
| 6,159,874 A | * | 12/2000 | Tews et al. | 438/253 |
| 6,177,696 B1 | | 1/2001 | Bronner et al. | |
| 6,204,141 B1 | * | 3/2001 | Lou | 438/386 |
| 6,448,131 B1 | * | 9/2002 | Cabral et al. | 438/243 |
| 6,455,369 B1 | * | 9/2002 | Forster et al. | 438/249 |
| 6,555,430 B1 | | 4/2003 | Chudzik et al. | |
| 6,559,002 B1 | * | 5/2003 | Kudelka et al. | 438/243 |
| 6,559,005 B2 | * | 5/2003 | Gutsche et al. | 438/255 |
| 6,559,069 B2 | * | 5/2003 | Goldbach et al. | 438/770 |
| 6,723,611 B2 | * | 4/2004 | Akatsu et al. | 438/386 |
| 2004/0079979 A1 | * | 4/2004 | Lee et al. | 257/301 |

* cited by examiner

*Primary Examiner*—Matthew Smith
*Assistant Examiner*—Renzo N. Rocchegiani
(74) *Attorney, Agent, or Firm*—Margaret A. Pepper

(57) ABSTRACT

The capacitance of deep trench capacitors is enhanced by increasing the surface area of the doped region of the trench to be used for one electrode of the capacitor. After formation of the deep trench and a collar on an upper region of the trench, and after optional bottling of the trench, hemispherical silicon grain (HSG) is deposited on a lower region of the trench. The HSG is then oxidized, along with that portion of the silicon substrate not covered by HSG, to form a roughened surface in the trench, thereby enhancing the trench capacitance. Oxidation of the HSG and the substrate occurs simultaneously with formation of the buried plate, and the formed oxide may be stripped along with the collar, thereby providing a simpler and more robust capacitance enhancement scheme.

24 Claims, 3 Drawing Sheets

INTEGRATION SCHEME FOR ENHANCING CAPACITANCE OF TRENCH CAPACITORS

BACKGROUND OF INVENTION

The present invention relates generally to semiconductor integrated circuits (ICs), and more particularly to deep trench (DT) capacitors formed within such ICs. This invention also relates to a method for producing such DT capacitors within semiconductor ICs. Such ICs include, for example, memory ICs such as random access memories (RAMs), dynamic RAMs (DRAMs), synchronous DRAMs (SDRAMs), static RAMS (SRAMs), and read only memories (ROMs) or other memory ICs. Other ICs include devices such as programmable logic arrays (PLAs), application-specific ICs (ASICs), merged logic/memory ICs (embedded DRAMs), system-on-chip,(SoC), or any circuit devices utilizing trench capacitors.

A memory cell in an IC typically comprises a transistor and an associated capacitor. The capacitor, which is typically formed in a portion of a trench, consists of a pair of conductive plates, i.e., electrodes, which are separated from each other by a node dielectric material. Information or data is stored in the memory cell in the form of charge accumulated on the capacitor. As the density of ICs with memory cells is increased, the area for the capacitor is decreased and the amount of charge that the capacitor is able to accumulate is reduced. Thus, with less charge to detect, reading the information or data from the memory cell becomes much more difficult.

There are three known techniques for increasing the amount of charge within a limited fixed space or volume for the capacitor of a memory cell in a highly integrated circuit. These three known techniques include: (1) decreasing the thickness of the dielectric material, i.e., node dielectric, that is located between the capacitor plates; (2) changing the dielectric material to one with a dielectric constant higher than silicon oxide or silicon nitride; or (3) increasing the surface area of the space to be used for the capacitor.

The first two solutions have drawbacks associated therewith. For example, solution (1), which thins the capacitor dielectric, also increases leakage currents that may affect the memory retention performance of the capacitor and the reliability of the memory cell. Solution (2), which purports to change the dielectric material to a higher-dielectric material, will cause only a slight improvement in charge storage because the dielectric constant of suitable alternative dielectrics is only slightly higher than the dielectric material currently being used. Moreover, the substitution of alternative dielectrics may be more complicated, more expensive and provide fabrication problems that are heretofore unknown. Accordingly, solution (3), i.e., increasing the surface area of the space to be used for the capacitor, provides the most promise for substantially improving the amount of charge stored without causing any of the problems mentioned for solutions (1) and (2) above.

One previous solution to increase the surface area of the capacitor is to replace common stack capacitor technology with trench capacitors. In common stack capacitor technology, the capacitor is built on a surface created on a semiconductor substrate, whereas in trench capacitor technology, the capacitor is formed within a trench that is formed in a semiconductor substrate itself. As depth of the trench increase, the surface area of the capacitor also increases. However, the depth of the trench is limited by present fabrication methods and tools. This problem is further compounded by the forever increasing density of ICs achieved by dimensional shrinkage. To offset the loss of surface area due to a reduction in width, the depth of the trench must be further increased to the point where the necessary depth is not achievable or becomes prohibitively expensive.

Another method of increasing the surface area of the capacitor is to provide capacitor plates that contain textured or roughened surfaces in-the deep trench adjacent to the dielectric material. A capacitor plate having roughened surface area increases the amount of surface area of the capacitor due to the peaks and valleys of the roughened surface. The depth of the trench is maximized and the rough surface of the plates is designed to give maximum surface area based on a cross-section of the roughened surface so that the surface area is three-dimensional at the interface of the plates and the dielectric material.

For example, U.S. Pat. No. 6,177,696 discloses a trench capacitor in which capacitance is increased by using hemispherical grained silicon (HSG). An amorphous silicon film is deposited on sidewalls of the deep trench, and then converted into a HSG film. The HSG film may be formed either before or after formation of the buried plate for the lower electrode of the deep trench capacitor. The HSG film must be doped with the same dopant as used for the buried plate. Doping of the HSG film may occur either during or after formation of the HSG film. The presence of the doped HSG film on sidewalls of the deep trench increases the surface area of the lower electrode in the deep trench. The remainder of the deep trench capacitor may be formed by depositing node silicon nitride film within the deep trench, and then filling the trench with doped polysilicon film to form the upper electrode. The method of this patent produces a deep trench capacitor having increased surface area on the lower electrode, but subsequent high temperature processing often causes smearing of the amorphous HSG film, such that the HSG film hardly survives in the final product. In addition, increased node leakage current and degraded reliability may be experienced as a result of the HSG film.

In U.S. Pat. No. 6,555,430, another method for increasing the surface area of the lower electrode is disclosed. In this method, an HSG film is formed on lower sidewalls of the deep trench, conventionally using a collar structure to mask upper sidewalls. An oxidation process is then performed so as to oxidize the HSG film as well as exposed portions of the substrate sidewall. The oxidized HSG film and the oxidized portion of the substrate are then removed, leaving a roughened surface on the deep trench sidewall. The buried plate may be formed either before or after the HSG surface enhancement. Performing the HSG oxidation after the buried plate is formed may result in undesired dopant loss in the buried plate. On the other hand, if the HSG oxidation and removal is performed before the buried plate is formed, undesired doping in the upper trench may occur due to collar damage during HSG oxidation and stripping.

Therefore, there remains a need in the art for a method of enhancing the capacitance of trench capacitors. Specifically, there is a need in the art for a simpler and more robust integration scheme to enhance the capacitance of trench capacitors.

SUMMARY OF INVENTION

These and other deficiencies in the prior art are overcome through the method of this invention for enhancing the capacitance of trench capacitors. The invention is directed to a method for forming a deep trench capacitor structure. The method comprises the steps of: (a) forming a deep trench in a semiconductor substrate, the deep trench having an upper region and a lower region; (b) forming a collar on interior walls of the upper region of the deep trench; (c) forming a layer of hemispherical silicon grain on exposed interior walls of the lower region of the deep trench; (d) annealing the substrate in an environment comprising oxygen while simultaneously forming a doped region in the substrate, thereby oxidizing the layer of hemispherical silicon grain and oxidizing a portion of the substrate to form a roughened surface on interior walls of the lower region of the deep trench; and (e) removing the oxidized layer of hemispherical silicon grain and the oxidized portion of the substrate.

In accordance with one aspect of the invention, formation of the doped region in the substrate comprises the steps of: forming a layer of doped material such as arsenic-doped silicate glass (ASG) on the layer of hemispherical silicon grain and on exposed interior walls of the lower region of the deep trench; and annealing the substrate in an environment comprising oxygen, thereby simultaneously forming a doped region in the substrate, oxidizing the layer of hemispherical silicon grain and oxidizing a portion of the substrate to form a roughened surface on interior walls of the lower region of the deep trench.

In accordance with another aspect of the invention, formation of the doped region in the substrate comprises the step of: annealing said substrate in an environment comprising oxygen and at least one dopant specie, thereby simultaneously forming a doped region in the substrate, oxidizing the layer of hemispherical silicon grain and oxidizing a portion of the substrate to form a roughened surface on interior walls of the lower region of the deep trench.

The method preferably further includes a bottling step, i.e., subjecting the lower region of the deep trench to an isotropic etching process, prior to forming the layer of hemispherical silicon grain.

The layer of hemispherical silicon grain is preferably a discontinuous layer having gaps therein which expose portions of the interior walls of the deep trench lower region, such that the exposed portions of the interior walls are oxidized during the annealing step.

The collar is preferably removed simultaneously with the removal of the oxidized layer of hemispherical silicon grain and the oxidized portion of said substrate.

BRIEF DESCRIPTION OF DRAWINGS

The features and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

For purposes of discussion, this invention is described in the context of a DRAM cell. However, the invention extends to formation of trench capacitors in general.

In this invention, the capacitance of deep trench capacitors is enhanced through use of a simpler and more robust integration scheme. After formation of the deep trench and a collar on an upper region of the trench, hemispherical silicon grain (HSG) is deposited on a lower region of the trench. The HSG is then oxidized, along with that portion of the silicon substrate not covered by HSG, to form a roughened surface in the trench, thereby enhancing the trench capacitance. Oxidation of the HSG and the substrate occurs simultaneously with formation of the buried plate. The formed oxide may be stripped along with the collar.

Figure 1:
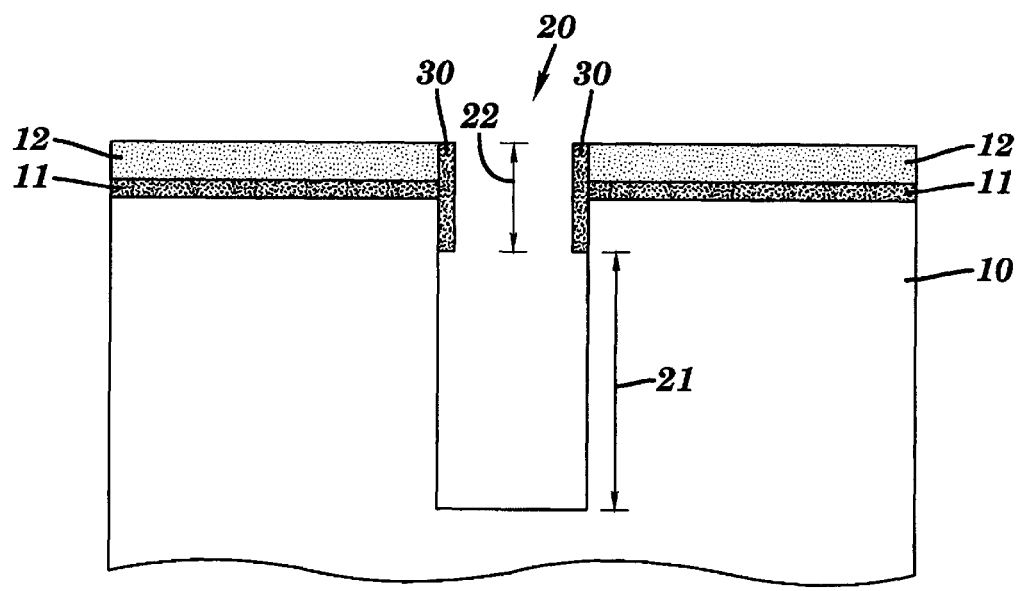
FIGS. 1–6 illustrate a preferred embodiment of the method for forming a deep trench capacitor of the present invention.

Referring now to FIGS. 1–6, in which a preferred embodiment of the method of this invention is illustrated, FIG. 1 shows a cross section of a deep trench 20 formed within a structure including a semiconductor substrate 10. In a preferred embodiment, the semiconductor substrate 10 may be a silicon substrate. A pad oxide film 11 and a pad nitride film 12 (typically silicon nitride) may be formed on a top surface of substrate 10. The thickness of the pad oxide film 11 and pad nitride film 12 are not critical to the present invention, but typically the thickness of pad oxide film 11 is from about 1 to about 10 nm and the thickness of pad nitride film 12 is from about 20 to about 500 nm.

Conventional lithography and etching such as reactive ion etching (RIE) may be employed to form deep trench 20, which extends through films 12 and 11 and into substrate 10. In a preferred embodiment, the depth of trench 20 may exceed the width by at least twenty-five times. For example, the depth may be about 5–10 $\mu$m and the width may be about 0.1–0.2 $\mu$m. Trench 20 may be divided into a lower region 21 and an upper region 22.

After formation of trench 20, collar 30 is formed in the upper region 22 of the trench using any conventional processing technique well known to those skilled in the art. The collar 30 may comprise a deposited oxide such as tetraethylorthosilicate (TEOS), or it may be grown thermally. Alternatively, in a preferred embodiment, collar 30 may be formed of a nitride by utilizing a conventional deposition technique. Specifically, collar 30 may be formed by filling trench 20 with oxide, recessing the oxide to a depth equal to the top of lower region 21, depositing or growing collar 30 in the upper region 22, and then selectively removing the oxide from the trench. Other suitable methods may also be used for forming the collar 30.

Figure 2:
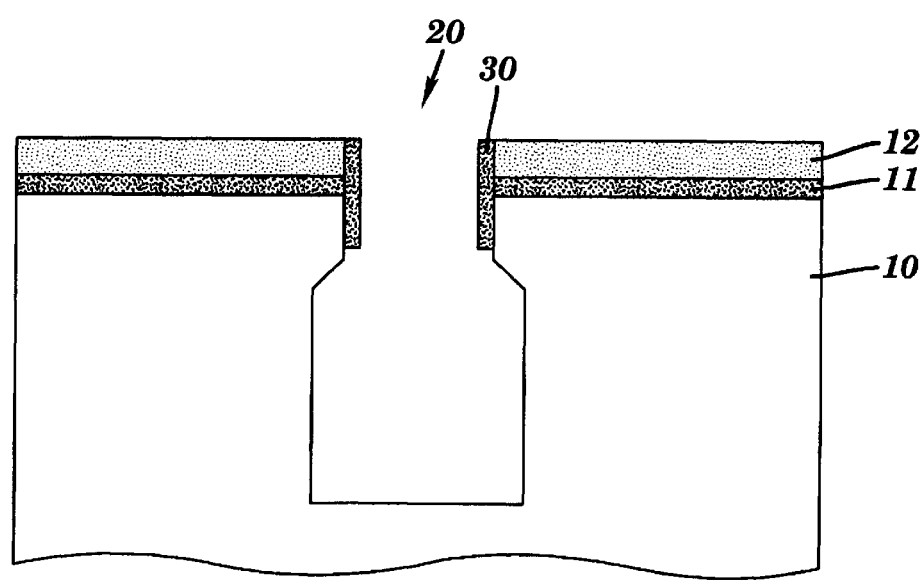

Following formation of collar 30, the lower region of the trench, which is defined herein to be the portion of the trench that is beneath collar 30, may be optionally subjected to a conventional isotropic etching process that is capable of forming a trench that contains a broadened lower trench region. This isotropic etching process is commonly known as "bottling," and the resultant broadened lower trench region is shown in FIG. 2. Although the broadened lower trench region is depicted in the remaining figures, this bottling step is optional and the following processing steps are equally applicable for structures having a lower trench region which has not been broadened.

Figure 3:
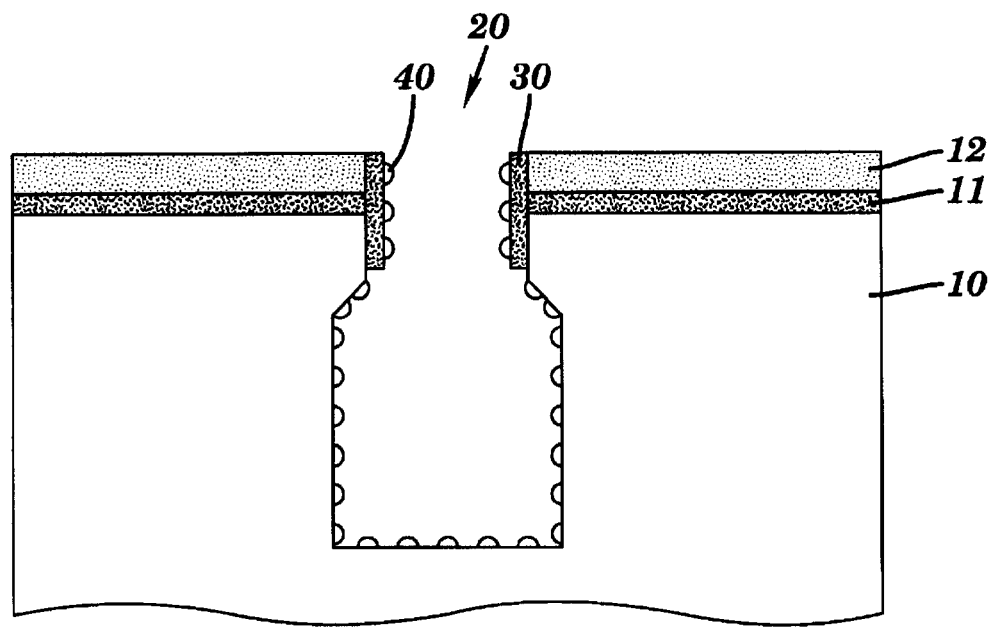

FIG. 3 shows formation of a hemispherical silicon grain (HSG) layer 40 on interior sidewalls and the bottom wall of trench 20. In the preferred embodiment shown in FIG. 3, the HSG layer 40 is a discontinuous layer having gaps therein which expose portions of substrate 10. The HSG layer 40 may be formed utilizing a conventional deposition process such as chemical vapor deposition (CVD) which is capable of forming an amorphous and/or polycrystalline silicon layer which includes amorphous silicon islands and/or polycrystalline grains separated from each other by gaps. The HSG layer preferably has a thickness of less than 250 Å, more preferably about 100 to about 150 Å.

Figure 4:
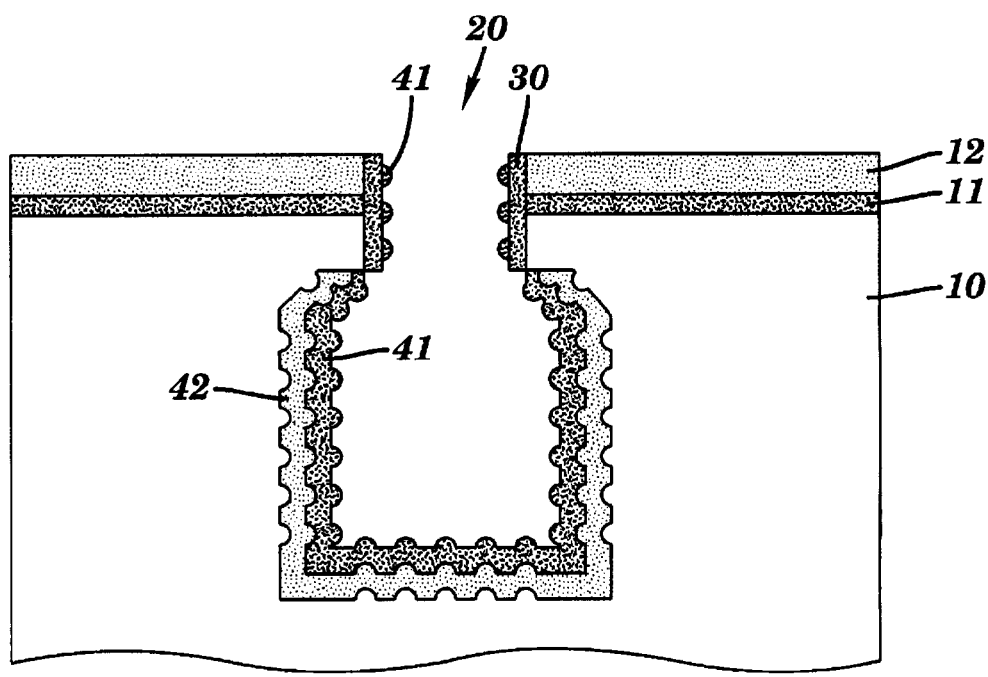

Next, as illustrated in FIG. 4, buried plate region 42 is formed while the HSG layer and exposed portions of the substrate are simultaneously oxidized so as to form oxide layer 41. In one embodiment, buried plate region 42, which represents one electrode of the trench capacitor, may be formed in the lower region of trench 20 by first depositing a doped material layer such as arsenic-doped silicate glass (ASG) in the lower portion of the trench including on the sidewalls and bottom wall portion; out-diffusing the dopant from the doped material layer using conventional annealing conditions well known to those skilled in the art; and removing any remaining doped material layer from the lower portion of the trench. The HSG layer and exposed portions of the substrate may be simultaneously oxidized during out-diffusing of the dopant by annealing in an oxidizing environment. The oxidizing atmosphere may contain, for example, air, $O_2$, NO and/or $N_2O$. Other gases such as; nitrogen and/or argon may be added. The annealing is preferably performed at a temperature of 800 to 1200° C. for 1 to 60 minutes, more preferably at about 1050° C., for about 10 minutes.

In an alternative embodiment, buried plate region 42 may be formed using a gas-phase doping (GPD) process in which an oxidant is added to the gas-phase dopant. Arsine and oxygen are preferably used in the GPD process, although other gases such as nitrogen and/or argon may be optionally added. Preferred GPD process conditions include pressure of about 100 to 500 Torr, more preferably 200 to 300 Torr; temperature of about 800 to 1100° C., more preferably 900 to 1000° C.; and time of about 10 to 300 minutes, more preferably 120 to 180 minutes. Under these preferred conditions, arsenic is driven into the substrate to form buried plate 42. Meanwhile, the oxygen causes the oxidation of HSG and the exposed portions of the substrate. In another embodiment, GPD and oxidation may be performed alternately in the same chamber by alternately switching the gas of arsine and oxygen.

The oxidation of the HSG layer and exposed portions of the substrate result in a continuous layer 41 which comprises the oxidized discrete silicon islands as well as the oxidized portions of the substrate. Layer 41 has a roughened surface, which is translated to the surface of substrate 10 in the lower trench region, resulting in a roughened surface on buried plate 42.

Figure 5:
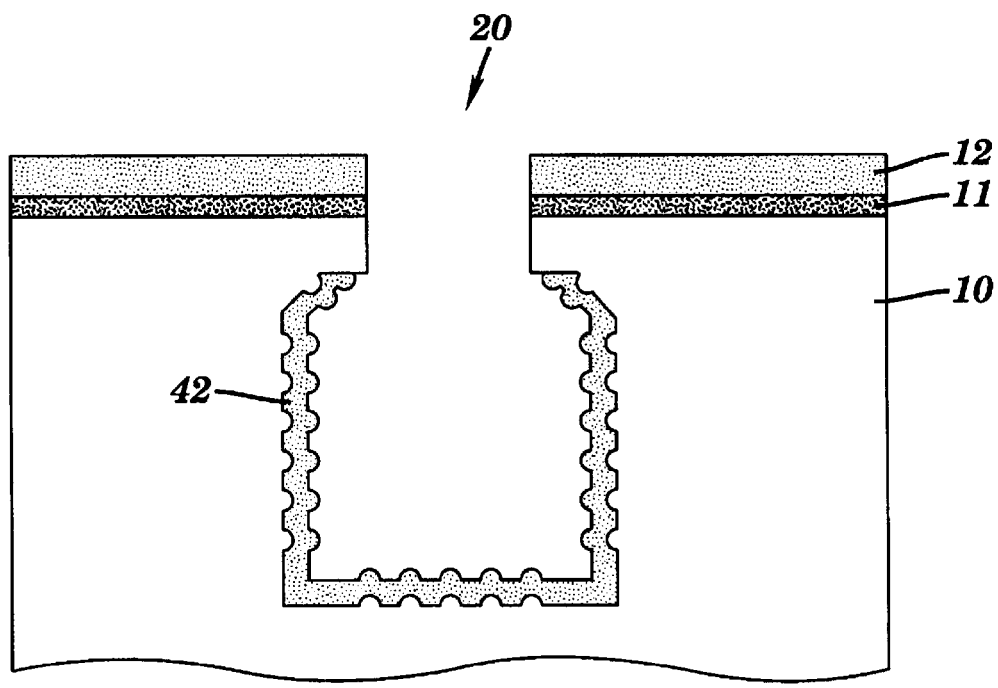

Next, as illustrated in FIG. 5, an oxide etching step is performed to remove oxide layer 41 from the lower portion of the trench, leaving buried plate 42 with a roughened surface. In one embodiment, this oxide removal step comprises the use of a wet chemical etchant such as HF, or HF in combination with ethylene glycol. This removal step results in exposure of a roughened surface on the sidewalls and bottom wall of the lower portion of the trench, i.e., the buried plate region 42. The collar 30 also may be removed during this etching step.

Figure 6:
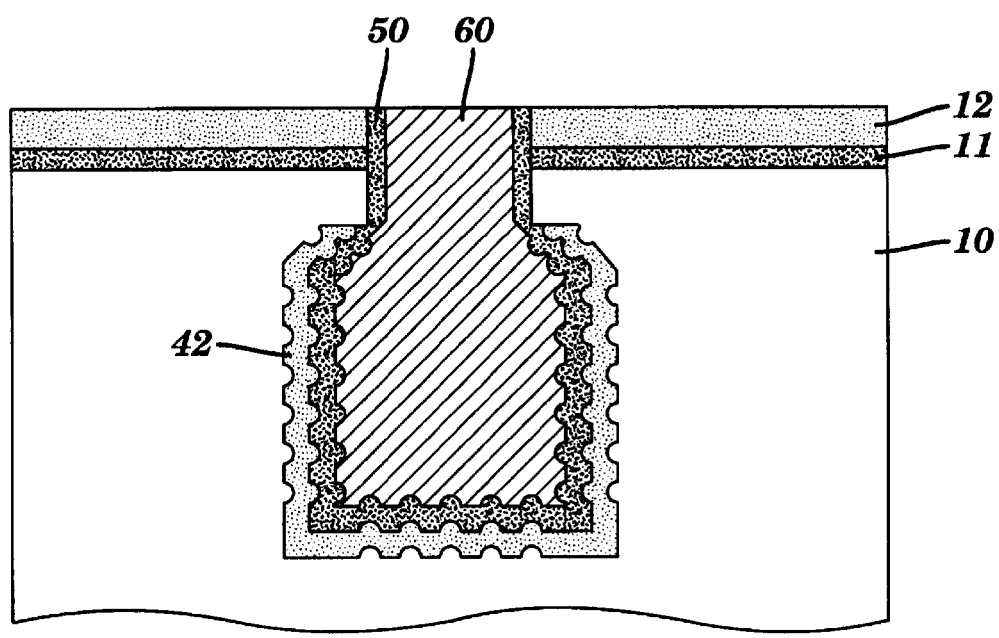

In FIG. 6, the node dielectric 50 and the other plate 60 of the capacitor are formed in the trench region. Node dielectric layer 50, typically silicon nitride, may be formed by any suitable process, such as by low pressure chemical vapor deposition (LPCVD). This node dielectric 50 will function as a dielectric of the deep trench capacitor, isolating the capacitor plates.

Following formation of node dielectric 50, the trench is filled with a conducting material 60 such as doped polysilicon or a metal, to create the other electrode of the capacitor. The trench may be filled with the conducting material 60 by any suitable process. In one embodiment, arsenic-doped polysilicon may be formed using alternate deposition and doping steps. The deposition steps may include an LPCVD process using silane to deposit an intrinsic polysilicon film on the structure. This deposition step is followed by soaking the structure in arsine. The process sequence is then repeated until the desired doping level is achieved. Then, the trench 20 is filled with intrinsic polysilicon to produce arsenic-doped polysilicon 60. The heat provided in the subsequent deposition steps drives the arsenic throughout the film. FIG. 6 shows the structure after excess node dielectric material 50 and doped material 60 has been removed by, for example, chemical mechanical polishing (CMP).

The method of this invention provides a simpler process for increasing the surface area of the capacitor plate, and thereby enhancing the capacitance. The process is simpler because the steps of buried plate formation and surface enhancement by oxidation of HSG are performed simultaneously, and the oxidized HSG and trench sidewalls may be removed simultaneously with the collar. The method of this invention also provides a more robust process, in that undesired doping in the upper trench is suppressed, while buried plate doping is enhanced.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method for forming a deep trench capacitor structure, the method comprising the steps of:
   (a) forming a deep trench in a semiconductor substrate, said deep trench having an upper region and a lower region;
   (b) forming a collar on interior walls of said upper region of said deep trench;
   (c) forming a layer of hemispherical silicon grain on exposed interior walls of said lower region of said deep trench;
   (d) annealing said substrate in an environment comprising oxygen while simultaneously forming a doped region in said substrate, thereby oxidizing said layer of hemispherical silicon grain and oxidizing a portion of said substrate to form a roughened surface on interior walls of said deep trench; and
   (e) removing said oxidized layer of hemispherical silicon grain and said oxidized portion of said substrate.

2. The method of claim 1, wherein said deep trench has a depth and a width, and said depth exceeds said width by at least twenty-five times.

3. The method of claim 1, wherein said semiconductor substrate comprises silicon.

4. The method of claim 3, wherein said semiconductor substrate further comprises a pad oxide film on an upper surface of said substrate and a pad nitride film on said pad oxide film.

5. The method of claim 1, wherein said deep trench is formed using lithography and etching processes.

6. The method of claim 1, wherein said collar comprises oxide and is deposited using tetraethylorthosilicate.

7. The method of claim 1, wherein said collar comprises oxide and is thermally grown.

8. The method of claim 1, wherein said collar comprises nitride.

9. The method of claim 1, further comprising, prior to step (c), the step of subjecting said lower region of said deep trench to an isotropic etching process.

10. The method claim 1, wherein said layer of hemispherical silicon grain is a discontinuous layer having gaps therein which expose portions of said interior walls of said lower region of said deep trench.

11. The method of claim 1, wherein step (d) comprises the steps of:

forming a layer of doped material on said layer of hemispherical silicon grain and on exposed interior walls of said deep trench; and annealing said substrate in an environment comprising oxygen.

12. The method of claim 1, wherein step (d) comprises the step of:

annealing said substrate in an environment comprising oxygen and at least one dopant species.

13. The method of claim 1, wherein said oxidized layer of hemispherical grain silicon and said oxidized layer portion of said substrate are removed using an oxide etchant comprising HF.

14. The method of claim 1, further comprising the step of removing said collar simultaneously with said removal of said oxidized layer of hemispherical silicon grain and said oxidized portion of said substrate.

15. The method of claim 1, after step (e), further comprising the steps of:

(f) forming a node dielectric layer on interior walls of said deep trench; and (g) filling said deep trench with a conducting material.

16. The method of claim 15, wherein said node dielectric layer comprises silicon nitride, and said conducting material comprises arsenic-doped polysilicon.

17. A method for forming a deep trench capacitor structure, the method comprising the steps of:

forming a deep trench in a semiconductor substrate, said deep trench having an upper region and a lower region;

forming a collar on interior walls of said upper region of said deep trench;

forming a layer of hemispherical silicon grain on exposed interior walls of said lower region of said deep trench;

forming a layer of arsenic-doped material on said layer of hemispherical silicon grain and on exposed interior walls of said lower region of said deep trench;

annealing said substrate in an environment comprising oxygen, thereby simultaneously forming a doped region in said substrate, oxidizing said layer of hemispherical silicon grain and oxidizing a portion of said substrate to form a roughened surface on interior walls of said lower region of said deep trench; and removing said oxidized layer of hemispherical silicon grain and said oxidized portion of said substrate.

18. The method of claim 17, further comprising, prior to forming said layer of hemispherical silicon grain, the step of subjecting said lower region of said deep trench to an isotropic etching process.

19. The method claim 17, wherein said layer of hemispherical silicon grain is a discontinuous layer having gaps therein which expose portions of said interior walls of said lower region of said deep trench.

20. The method of claim 17, further comprising the step of removing said collar simultaneously with said removal of said oxidized layer of hemispherical silicon grain and said oxidized portion of said substrate.

21. A method for forming a deep trench capacitor structure, the method comprising the steps of:

forming a deep trench in a semiconductor substrate, said deep trench having an upper region and a lower region;

forming a collar on interior walls of said upper region of said deep trench;

forming a layer of hemispherical silicon grain on exposed interior walls of said lower region of said deep trench;

annealing said substrate in an environment comprising oxygen and at least one dopant species, thereby simultaneously forming a doped region in said substrate, oxidizing said layer of hemispherical silicon grain and oxidizing a portion of said substrate to form a roughened surface on interior walls of said lower region of said deep trench; and removing said oxidized layer of hemispherical silicon grain and said oxidized portion of said substrate.

22. The method of claim 21, further comprising, prior to forming said layer of hemispherical silicon grain, the step of subjecting said lower region of said deep trench to an isotropic etching process.

23. The method claim 21, wherein said layer of hemispherical silicon grain is a discontinuous layer having gaps therein which expose portions of said interior walls of said lower region of said deep trench.

24. The method of claim 21, further comprising the step of removing said collar simultaneously with said removal of said oxidized layer of hemispherical silicon grain and said oxidized portion of said substrate.

* * * * *